(12) United States Patent
Franken et al.

(10) Patent No.: US 7,362,415 B2
(45) Date of Patent: Apr. 22, 2008

(54) LITHOGRAPHIC APPARATUS AND DEVICE MANUFACTURING METHOD

(75) Inventors: Dominicus Jacobus Petrus Adrianus Franken, Veldhoven (NL); Arno Jano Bleeker, Westerhoven (NL); Wilhelmus Josephus Box, Eksel (BE); Martinus Hendricus Hendricus Hoeks, Breugel (NL); Henricus Gerardus Tegenbosch, Eindhoven (NL); Kars Zeger Troost, Waalre (NL); Lambertus Gerardus Maria Kessels, Aalst-Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 146 days.

(21) Appl. No.: 11/005,231

(22) Filed: Dec. 7, 2004

(65) Prior Publication Data

US 2006/0119815 A1 Jun. 8, 2006

(51) Int. Cl.
*G03B 27/54* (2006.01)
*G03B 27/42* (2006.01)
*G03B 27/52* (2006.01)

(52) U.S. Cl. .............................. 355/67; 355/53; 355/30
(58) Field of Classification Search .................. 355/30, 355/53, 67, 72–76; 359/845
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,552,773 | B2 * | 4/2003 | Emoto .......................... 355/53 |
| 6,687,041 | B1 | 2/2004 | Sandstrom |
| 6,747,783 | B1 | 6/2004 | Sandstrom |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 7,023,528 | B2 * | 4/2006 | Hsu et al. ...................... 355/71 |
| 7,106,414 | B2 * | 9/2006 | Tsuji et al. .................... 355/30 |
| 2004/0041104 | A1 | 3/2004 | Liebregts et al. |
| 2004/0051984 | A1 * | 3/2004 | Oshino et al. .............. 359/845 |
| 2004/0130561 | A1 | 7/2004 | Jain |
| 2005/0007572 | A1 | 1/2005 | George et al. |
| 2005/0074906 | A1 * | 4/2005 | Kochersperger ................ 438/7 |

FOREIGN PATENT DOCUMENTS

| WO | WO 98/33096 | 7/1998 |
| WO | WO 98/38597 | 9/1998 |

* cited by examiner

*Primary Examiner*—Henry Hung Nguyen
(74) *Attorney, Agent, or Firm*—Sterne, Kessler, Goldstein & Fox P.L.L.C.

(57) ABSTRACT

A system and method are used to allow for compensation of a thermal output of an array of individually controllable elements. This can be done by inputting control signals to the array when it is not being used to pattern a projection beam in order to maintain the temperature of the array. A heating element can be provided to maintain the temperature of the array. A thermal reservoir can be provided to maintain the temperature of the array or a cooling element can be provided to reduce the temperature of the array during use.

20 Claims, 6 Drawing Sheets

LITHOGRAPHIC APPARATUS AND DEVICE MANUFACTURING METHOD

BACKGROUND

1. Field of the Invention

Figure 1:
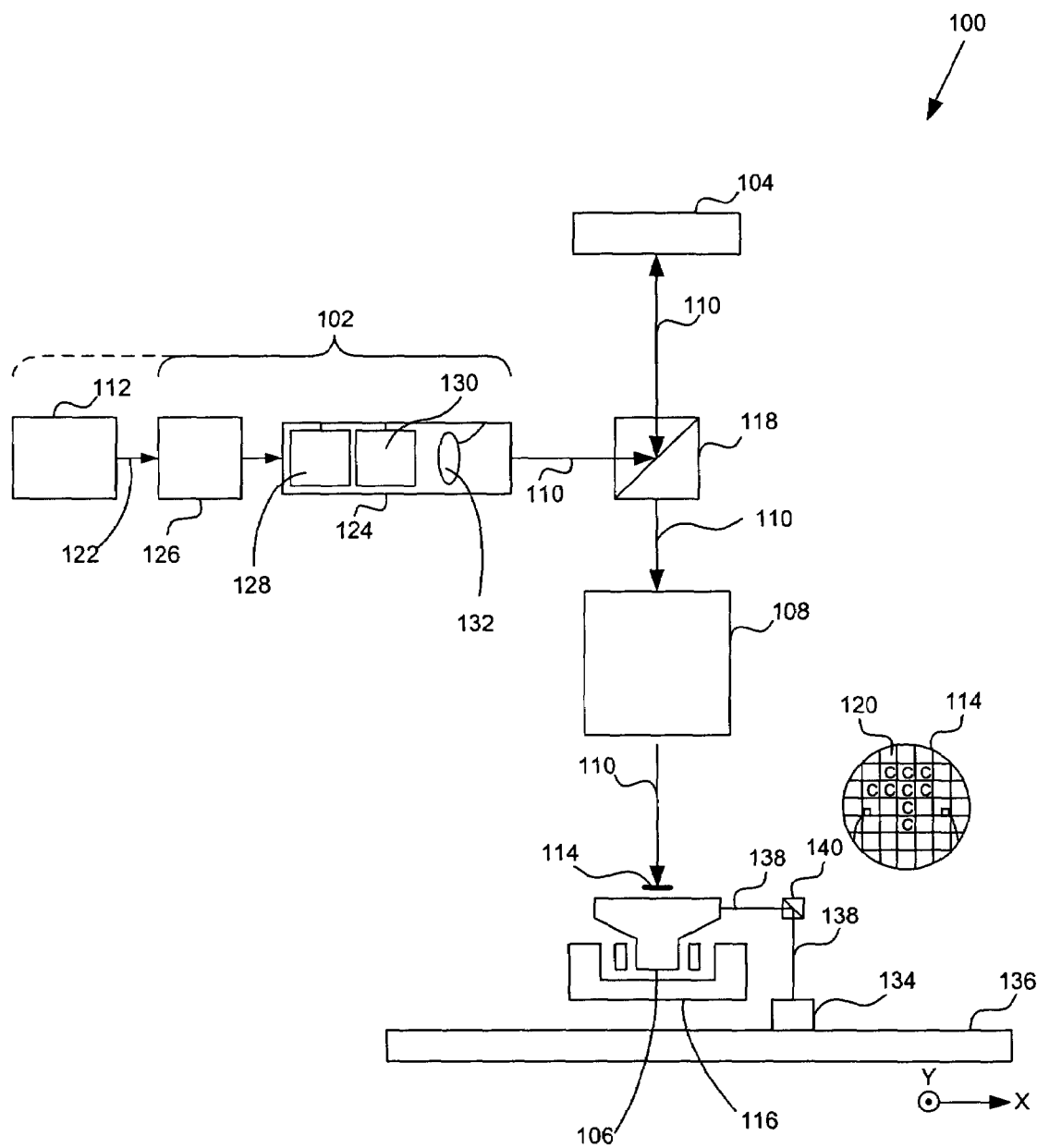

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, that is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning" direction), while synchronously scanning the substrate parallel or ant parallel to this direction.

In lithographic apparatus, components that generate heat can introduce into the apparatus positional errors between components due to thermal expansion. This, in turn reduces the accuracy of the images generated by the lithographic apparatus. Accordingly, it is desirable to minimize the generation of heat by components within the lithographic apparatus.

Known arrays of individually controllable elements contain of the order of two million or more individually controllable elements. Each element is provided with a control signal in order to control the element and heat is generated both by the provision of the control signal and by the switching of the individually controllable element between two states. Accordingly, although the heat to be dissipated for each individually controllable element can be small, overall there can be a significant amount of heat to be dissipated from an array of individually controllable elements. Furthermore, the generation of heat within the array of individually controllable elements is dependent of the pattern formed. Therefore, unlike many other components within a lithographic apparatus, the heat generation within an array of individually controllable elements is not constant.

Therefore, what is needed is a system and method to manage heat generated in arrays of individually controllable elements, such that impact on imaging capability caused by such heat generation is substantially reduced.

SUMMARY

According to an aspect of the invention, there is provided a lithographic apparatus comprising an illumination system, an array of individually controllable elements, a controller, and a projection system. The illumination system conditions a beam of radiation. The array of individually controllable elements patterns the beam. The controller provides pattern control signals to the array of individually controllable elements to set the elements, as required, to impart the pattern. The projection system projects the patterned beam onto a target portion of a substrate. The controller sends additionally ancillary control signals to at least part of the array of individually controllable elements when no pattern is required to be set on the at least part of the array of individually controllable elements.

According to a further aspect of the invention, there is provided a lithographic apparatus comprising an illumination system, an array of individually controllable elements, a projection system, and a heating element. The illumination system conditions a beam of radiation. The array of individually controllable elements patterns the beam. The projection system projects the patterned beam onto a target portion of a substrate. The heating element is in thermal contact with the array of individually controllable elements and an associated heating controller that controls the heating element.

According to a further aspect of the invention, there is provided a lithographic apparatus comprising an illumination system, an array of individually controllable elements, and a projection system. The illumination system conditions a beam of radiation. The array of individually controllable elements patterns the beam. The projection system projects the patterned beam onto a target portion of the substrate. The array of individually controllable elements is thermally coupled to a thermal reservoir having a heat capacity selected such that, in operation, when the array of individually controllable elements generates more heat than its average heat generation in operation, heat is transferred to the thermal reservoir preventing the temperature of the array of individually controllable elements from rising above a first predetermined level. Also, when the array of individually controllable elements generates less heat that its average heat generation in operation, heat is transferred from the thermal reservoir to the array of individually controllable elements preventing the temperature of the array of individually controllable elements from falling below a second predetermined level.

According to a further aspect of the invention, there is provided a lithographic apparatus comprising an illumination system, an array of individually controllable elements, a projection system, and a cooling element. The illumination system conditions a beam of radiation. The array of individually controllable elements patterns the beam. The projection system projects the patterned beam onto a target portion of the substrate. The cooling element is in thermal contact with the array of individually controllable elements and an associated cooling controller that controls the cooling element.

According to a further aspect of the invention, there is provided a device manufacturing method comprising the following steps. Conditioning a beam of radiation using an illumination system. Providing pattern control signals to an array of individually controllable elements to set the elements, as required, to impart the beam with a pattern in its cross-section. Projecting the patterned beam of radiation onto a target portion of a substrate. Sending ancillary control signals to at least part of the array of individually controllable elements when no pattern is required to be set on the at least part of the array of individually controllable elements.

According to a further aspect of the invention, there is provided a device manufacturing method comprising the following steps. Conditioning a beam of radiation using an illumination system. Using an array of individually controllable elements to impart the beam with a pattern in its cross-section. Projecting the patterned beam of radiation onto a target portion of a substrate. Providing heat to the array of individually controllable elements using a heating element in thermal contact with the array of individually controllable elements and controlled by an associated heating controller.

According to a further aspect of the invention, there is provided a device manufacturing method comprising the following steps. Conditioning a beam of radiation using an illumination system. Using an array of individually controllable elements to impart the beam with a pattern in its cross-section. Projecting the patterned beam of radiation onto a target portion of the substrate. The array of individually controllable elements is thermally coupled to a thermal reservoir having a heat capacity selected such that, in operation, when the array of individually controllable elements generates more heat than its average heat generation in operation, heat is transferred to the thermal reservoir preventing the temperature of the array of individually controllable elements from rising above a first predetermined level. Also, when the array of individually controllable elements generates less heat that its average heat generation in operation, heat is transferred from the thermal reservoir to the array of individually controllable elements preventing the temperature of the array of individually controllable elements from falling below a second predetermined level.

According to a further aspect of the invention, there is provided a device manufacturing method comprising the following steps. Conditioning a beam of radiation using an illumination system. Using an array of individually controllable elements to impart the beam with a pattern in its cross-section. Projecting the patterned beam of radiation onto a target portion of a substrate. Absorbing heat from the array of individually controllable elements using a cooling element in thermal contact with the array of individually controllable elements and controlled by an associated cooling controller.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form apart of the specification, illustrate the present invention and, together with the description, further serve to explain the principles of the invention and to enable a person skilled in the pertinent art to make and use the invention.

FIG. 1 depicts a lithographic apparatus, according to one embodiment of the present invention.

FIGS. 2, 3, 4, 5, 6, 7, 8, 9, and 10 depict control systems associated with programmable patterning devices, according to various embodiments of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of that can be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors; in this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, that are incorporated herein by reference in their entireties.

A programmable LCD array can also be used. An example of such a construction is given in U.S. Pat. No. 5,229,872, that is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in that the eventual pattern formed on each part of the substrate is built up over a given period of time or a given number of exposures during that the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultraviolet (EUV) radiation (e.g., having a wavelength in the range of 520 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), that in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for that the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, that focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long stroke module (course positioning) and a short stroke module (fine positioning), that are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion that is capable of supporting substrate 114. This is conventionally referred to as an air bearing arrangement. Substrate 114 is moved over substrate table 106 using one or more actuators (not shown), that are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in that M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Exemplary Control Systems for Individually Controllable Element Arrays

FIGS. 2, 3, 4, 5, 6, 7, 8, 9, and 10 depict control systems associated with programmable patterning devices, according to various embodiments of the present invention.

Figure 2:
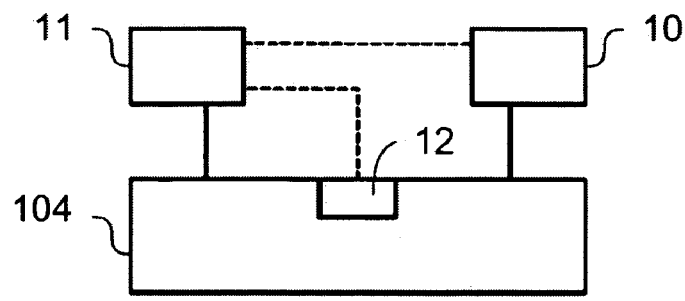

As shown in FIG. 2, the array of individually controllable elements 104 has a controller 10 that provides control signals to the array of individually controllable elements 104 in order to set the elements to the states required in order to provide the pattern to the beam of radiation. As discussed above, the provision of the control signals to the array of individually controllable elements 104 and the action of setting each of the elements to the required state causes heat to be generated. However, when no pattern is being set on the array of individually controllable elements, no heat is generated. This can cause the temperature of the array of individually controllable elements to vary during the operation of the lithographic apparatus, resulting in a reduction in the quality of the image produced. For example, following a prolonged period of use, the temperature of the array of the array of individually controllable elements can be significantly higher than the temperature of the array of individually controllable elements before operation of the lithographic apparatus commences. The temperature difference can result in expansion of the array of individually controllable elements which, in turn, results in an increase of the separation between the individually controllable elements, consequently changing the pattern projected onto the substrate.

It is therefore desirable to maintain a constant temperature in the array of individually controllable elements during operation of the lithographic apparatus. As shown in FIG. 2, the array of individually controllable elements can consequently be provided with an ancillary controller 11. The ancillary controller is configured to provide ancillary control signals to the array of individually controllable elements 104 at times when no pattern is required to be set on the array of individually controllable elements. For example, the ancillary control signals can be provided to the array of individually controllable elements between pulses of the beam of radiation. In the same way as the operation of the array of individually controllable elements in response to control signals from the controller 10 generates heat, the provision of the ancillary control signals from the ancillary controller 11 will also cause heating within the array of individually controllable elements. Therefore, the provision of the ancillary control signals can be timed to maintain the temperature of the array of individually controllable elements when it would not otherwise be in use.

As shown in FIG. 2, the ancillary controller 11 can be independent from the controller 10 that controls the array of individually controllable elements during the exposure of the substrate. Alternatively, or additionally, a single controller that provides both functions can be used.

The ancillary controller 11 can provide ancillary control signals to the entirety of the array of individually controllable elements in order to maintain the temperature of the complete array. Alternatively, or additionally, the ancillary control signals can be provided to only a portion of the array of individually controllable elements. For example, if for the exposure of a substrate, only a portion of the array of individually controllable elements is being set to provide a given pattern, the remainder of the array being left in its natural state, then only the portion of the array of individually controllable elements that is being patterned can be heated by the operation of the array of individually controllable elements during the exposures projected onto the substrate. In such a situation, the ancillary controller can only provide ancillary control signals to the part of the array of individually controllable elements that is not activated during the exposure steps, thereby ensuring that a substantially uniform temperature is maintained across the array of individually controllable elements.

The array of individually controllable elements 104 is typically arranged to receive two sets of signals in order to set the elements to the required states in order to provide the desired pattern. The first signal is a pattern signal which represents the states required for each individual element. The second signal is an actuator command signal that, when it is provided to the array of individually controllable elements, changes the state of the elements within the array of individually controllable elements to the states specified in the pattern signal. The actuator command signal is a single signal supplied to all of the elements within the array of individually controllable elements whereas the pattern signal provides individual signals to each of the individually controllable elements. Consequently, in many configurations of arrays of individually controllable elements (e.g., arrays of micro mirrors that can be individually actuated) the majority of the heat generated in the operation of the array of individually controllable elements results from the provision of the pattern signal. Accordingly, the ancillary control signals my only include the pattern signal, but not the actuator command signal. Therefore, when the ancillary control signal is provided to the array of individually controllable elements, significant heating is still created in order to maintain a uniform temperature of the array of individually controllable elements but the state of the individually controllable elements themselves does not change. This can be beneficial as the reliable lifetime of the individually controllable elements can be limited to a given number of changes of state and therefore it is desirable to limit the changes of state of the individually controllable elements to only occur when patterns are being set on the array of individually controllable elements for exposing a substrate.

The ancillary controller 11 can determine the extent to which heating is required of the array of individually controllable elements or a part of the array of individually controllable elements. This can control the requirement for ancillary control signals to be sent to the array of individually controllable elements. This can be done by monitoring the patterns that are set on the array of individually controllable elements for patterning the exposures of the substrate.

Alternatively, a temperature sensor 12 can be arranged within the array of individually controllable elements that monitors the temperature of the array of individually controllable elements. In this case, the ancillary controller 11 can be configured to send ancillary control signals to the array of individually controllable elements as necessary to maintain the required temperature of the array of individually controllable elements 104. It will be appreciated that the temperature sensor can be integral to the array of individually controllable elements or in thermal contact with it.

It will further be appreciated that the temperature sensor 12 can monitor the overall temperature of the array of individually controllable elements or can be configured to independently monitor the temperature at different locations on the array of individually controllable elements in order to enable the ancillary control signals only to be sent to the parts of the array of individually controllable elements 104 that require heating. Accordingly, it is easier to maintain a uniform temperature across the array.

As discussed above, prior to the commencement of the operation of the lithographic apparatus, the temperature of the array of individually controllable elements 104 can be lower than during a period of prolonged use of the lithographic apparatus. Accordingly, the array of individually controllable elements can need to be brought up to a working temperature before exposure of substrates commences. The ancillary controller 11 can be configured to provide ancillary control signals to the array of individually controllable elements prior to commencement of exposures of a substrate in order to bring the temperature of the array of individually controllable elements up to its working temperature. Similarly, if the exposure of a substrate is interrupted for a given length of time, the ancillary controller 11 can stop providing ancillary control signals to the array of individually controllable elements (and let the temperature of the array of individually controllable elements drop from its working temperature). Subsequently, before the exposure of the substrate recommences, the ancillary controller 11 provides the necessary ancillary control signals in order to return the array of individually controllable elements to its working temperature. A similar procedure can be used between the exposure of different substrates. The warm-up time can be reduced by operating the ancillary controller 11 together with the temperature sensor 12. In this case, the warm-up procedure can generate far more heat in the array of individually controllable elements than is generated in standard operation in order to rapidly raise the temperature without risking overheating.

Figure 3:
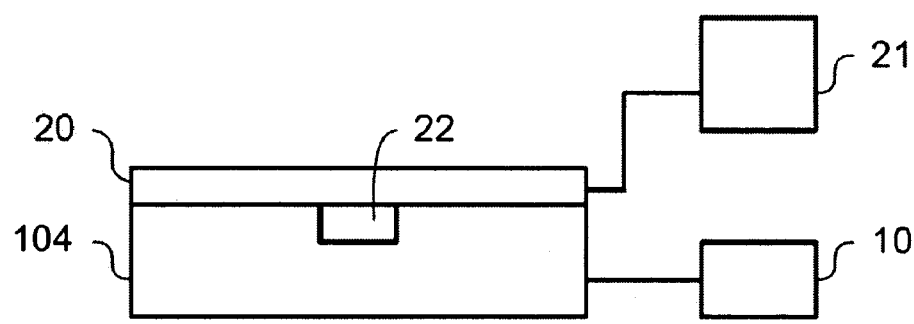

With reference to FIG. 3, in order to maintain the temperature of the array of individually controllable elements 104, a heating element 20 can be connected to the array, such that it can provide heat to the array in order to maintain its temperature. The heating element 20 is controlled by a controller 21. As with the embodiment shown in FIG. 2, the amount of heat to be generated by the heating element 20 can be determined by the controller from the patterns being set on the array of individually controllable elements and a determination from this of the amount of heat generated in the array of individually controllable elements from setting the patterns on the array. The controller 21 controls the heating element 20 such that the sum of the heat generated by the operation of the array of individually controllable elements 104 and the heat generated by the heating element 20 is largely constant. Alternatively, or additionally, the array of individually controllable elements 104 can be provided with a temperature sensor 22 that allows the controller 21 to control the heating element 20 such that the temperature of the array of individually controllable elements is maintained within a given range.

As with the embodiment shown in FIG. 2, the temperature of the array of individually controllable elements is maintained at a working temperature during operation of the lithographic apparatus but can be allowed to fall from the working temperature during interruptions in the operation of the lithographic apparatus, for example between exposures of different substrates. In this case, the controller 21 is configured to provide a warm-up phase prior to the resumption of the operation of the lithographic apparatus in which the heating element 20 raises the temperature of the array of individually controllable elements to the working temperature. Likewise a warm-up phase can be provided prior to initial operation of the lithographic apparatus.

In the same manner as the embodiment shown in FIG. 2, the heating element 20 can be arranged such that different portions of the array of individually controllable elements 104 can be heated independently.

Figure 4:
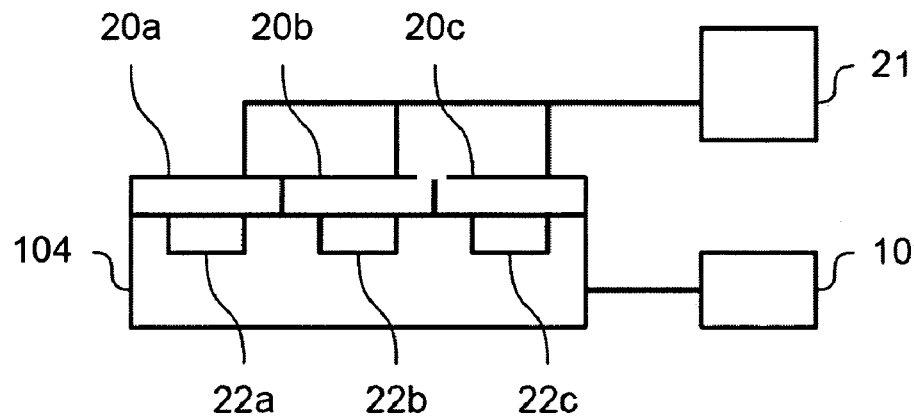

Such an arrangement is schematically shown in FIG. 4, according to one embodiment of the present invention. In this arrangement, the controller 21 independently controls the heating of different portions of the array of individually controllable elements using corresponding portions 20a,20b, 20c of the heating element 20 in order to maintain a uniform temperature within the array of individually controllable elements. The heating control can be determined by the patterns being set on each area of the array of individually controllable elements and/or by use of a temperature sensor 22 that can also be divided into corresponding portions 22a,22b,22c.

In one example, the heating element 20 is formed from an insulated resistance wire with a voltage applied across it to generate a current flow. Such an arrangement is simple to control and has a relatively quick response rate, enabling precise control of the temperature with a relatively simple control system. Furthermore, such an arrangement can easily be adapted to provide independent control of the amount of heat generated within different areas of the heating element. However, it will be appreciated that any suitable forms of heating element can be used, such as a conduit containing fluid that is heated in a manner corresponding to the cooling system described below in respect of the fourth embodiment.

In one example, the heating element can be in the form of a so-called "heat pipe," connected between the array of individually controllable elements 104 and a heat source. In such an arrangement, the heat source can, be located away from the main part of the lithographic apparatus. This is beneficial because it reduces the number of components within the working space of the lithographic apparatus and can prevent unwanted heating of other components within the lithographic apparatus. The heat pipe can be formed, for example, from a sealed conduit containing an appropriately selected material. Such a material will, for the temperature range of use, exist in both a gaseous state and a liquid state. Accordingly, at the end of the heat pipe connected to the heat source, the material is primarily in a liquid state, but on heating absorbs the heat from the heating element to change to the gaseous state. Similarly, at the end of the heat pipe connected to the array of individually controllable elements, the material in the gaseous state condenses, transferring heat to the array of individually controllable elements. Consequently, a simple cycle is formed that transfers heat from the heat source to the array of individually controllable elements. The heat pipe can be formed from a flexible conduit. Accordingly, although the heat source can, for example, be arranged in a part of the lithographic apparatus that is not fully insulated from vibrations, significant vibrations are not transferred to the array of individually controllable elements by the heat pipe.

The problems caused by variations in the amount of heat generated in the array of individually controllable elements 104 caused by different patterns being set on the array of individually controllable elements and by pauses between patterns being set on the array of individually controllable elements (e.g., between exposures on a substrate) during interruptions of the exposure of a substrate or between exposures of different substrates, can be overcome by attaching a thermal reservoir to the array of individually controllable elements.

Figure 5:
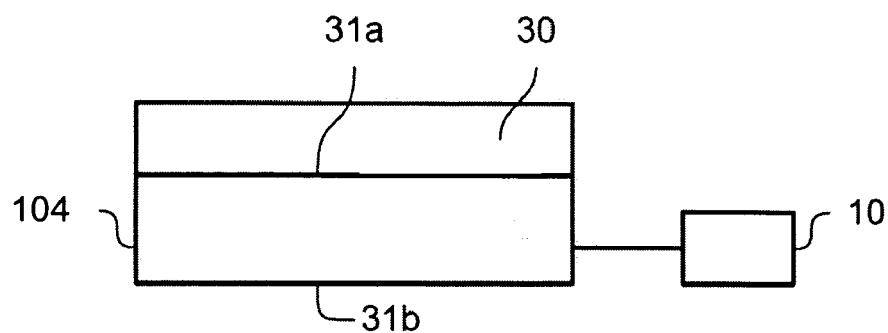

An example of an arrangement is shown in FIG. 5, according to one embodiment of the present invention. In this figure, a thermal reservoir 30 is bonded to the reverse side 31a of the array of individually controllable elements 104. The reverse side 31a of the array of individually controllable elements is the other side of the array than the side 31b on which the beam of radiation to be patterned is incident. The thermal reservoir can be a simple plate of material that has a relatively high heat capacity. For example, the thermal reservoir 30 can be formed from a metal, in particular aluminum, or a low expansion material such as INVAR™ (a cobalt containing steel), ZERUDOR™ (manufactured by Schott Glass, Hattenbergerstraße 10 55120, Mainz, Germany), ULE™ glass (manufactured by Corning Incorporated, 1 River Front Plaza, Corning, N.Y. 14831), or some combination of these.

The thermal reservoir 30 is connected to the array of individually controllable elements 104, such that heat can be transferred between the thermal reservoir and different parts of the array. Accordingly, heat generated in a first part of the array of individually controllable elements, for example a part of the array on which a pattern is set, can pass through the thermal reservoir 30 to another part of the array of individually controllable elements that is relatively cooler, for example that has no pattern set on it. Accordingly, the provision of the thermal reservoir 30 can assist in ensuring a uniform temperature across the array of individually controllable elements, provided the material of the thermal reservoir 30 is selected such that its thermal conductivity is sufficiently high.

The heat capacity of the thermal reservoir 30 is selected such that, during the anticipated operation of the array of individually controllable elements, the temperature of the array of individually controllable elements remains within a predetermined range. For example, during operation of the array of individually controllable elements 104, heat will be generated and transferred to the thermal reservoir 30. During periods when patterns are not being set on the array of individually controllable elements (or parts of it) heat will dissipate from the array of individually controllable elements, resulting in its temperature dropping and heat being transferred back from the thermal reservoir 30 to the array of individually controllable elements, thereby slowing the rate at which the temperature of the array of individually controllable elements drops during inactivity. By making the heat capacity of the thermal reservoir 30 sufficiently large, the drop in temperature during periods of inactivity can be reduced to be sufficiently small as to not result in any significantly severe effects on the imaging properties of the lithographic apparatus. The effect of the provision of the thermal reservoir 30 is to increase the overall heat capacity of the system that includes the array of individually controllable elements, thereby increasing the time constant of the cooling and/or heating of the system sufficiently, such that the temperature of the array of individually controllable elements is kept within the required range during the expected periods of activity and inactivity of the array of individually controllable elements.

Figure 6:
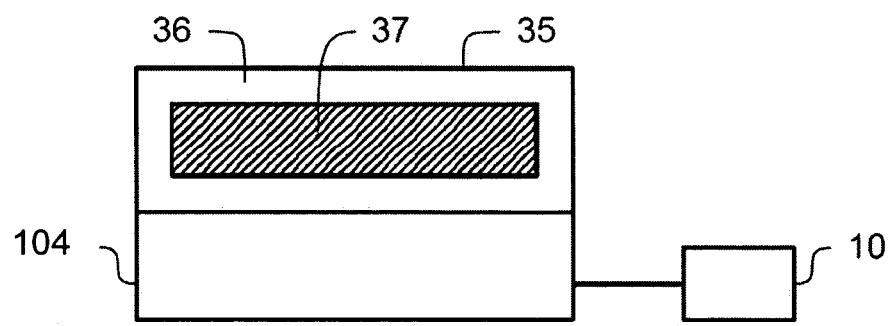

FIG. 6 depicts a configuration for the thermal reservoir, according to one embodiment of the present invention. In this case, the thermal reservoir 35 comprises a chamber 36 filled with a fluid 37. The provision of a fluid within a chamber can be beneficial in maintaining a uniform temperature across the array of individually controllable elements because heat can be transferred from one portion of the thermal reservoir to another by convection as well as conduction. Furthermore, the fluid can be selected for maximum heat capacity per unit of volume and/or mass of the material but need not be limited by other constraints on material selection caused by its use within a lithographic apparatus if it is within a closed chamber. The heat capacity of the thermal reservoir can be increased by providing a system in which fluid is pumped round a circuit including a portion in thermal contact with the array of individually controllable elements and, away from the array of individually controllable elements (e.g., isolated from it to prevent the transfer of vibrations) a larger reservoir of the fluid. Accordingly, the mass of the fluid in the system is increased, increasing the heat capacity of the thermal reservoir as a whole without increasing the volume of components attached to the array of individually controllable elements.

In one example, water is used as the fluid in the reservoir because it has a high specific heat capacity and its properties are well known and understood.

A lithographic apparatus can include more than one array of individually controllable elements. It will be appreciated that in such a situation, each of the arrays of individually controllable elements can be provided with an independent thermal reservoir. Alternatively, two or more of the arrays of individually controllable elements can be thermally coupled to a single thermal reservoir. This can beneficially enable the transfer of heat between the arrays of individually controllable elements, assisting in providing a uniform temperature between the arrays of individually controllable elements.

The provision of a thermal reservoir 30;35 is beneficial because it reduces the temperature variations within the array of individually controllable elements, thereby improving the imaging performance of the lithographic apparatus within significantly increasing the complexity of the lithographic apparatus overall.

The thermal reservoir can be directly connected to the array of individually controllable elements, for example as shown in FIGS. 5 and 6. Alternatively, the array of individually controllable elements can be thermally connected to the thermal reservoir by means of a heat pipe as described above. Accordingly, the design of the thermal reservoir can be optimized for its function without being constrained by limitations caused by its position within the lithographic apparatus. As discussed above, such a heat pipe can be formed from a flexible conduit, ensuring that the transfer of vibration to the array of individually controllable from the reservoir is minimized.

Thermally connecting the thermal reservoir to the array of individually controllable elements by a flexible thermal connection, such as a heat pipe, can reduce any stresses, such as shear stresses, in the array of individually controllable elements caused by differential thermal expansion of the thermal reservoir and the array of individually controllable elements. It will be appreciated that other ways of thermally connecting the thermal reservoir to the array of individually controllable elements without inducing stresses within the array of individually controllable elements caused by differential thermal expansion can also be used.

In an alternative approach to managing the temperature of an array of individually controllable elements 104, a cooling element can be provided that, by absorbing heat from the array of individually controllable elements, maintains the array of individually controllable elements at a desired temperature. Similarly, the cooling element can be used to maintain a uniform temperature across the array of individually controllable elements. The cooling element can be controlled by a cooling controller that determines the amount of heat to be absorbed by the cooling element from the array of individually controllable elements by monitoring the patterns set on the array (and hence the heat generated within the array of individually controllable elements) and/or by monitoring the temperature of the array of individually controllable elements using a temperature sensor. As with the previous embodiments, the cooling element can be used to control the overall temperature of the array of individually controllable elements and/or can be comprised of independently controllable parts for controlling the temperature of different parts of the array of individually controllable elements.

Figure 7:
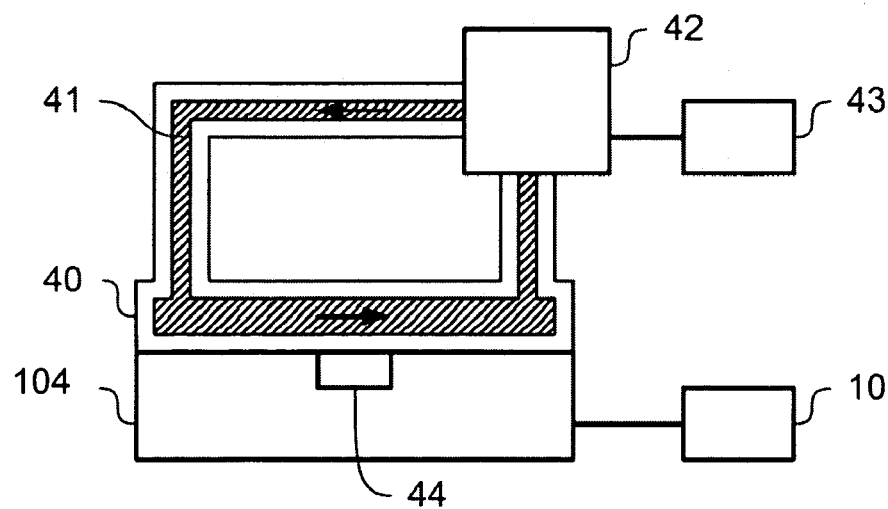

FIG. 7 shows an arrangement in which a conduit 40 is connected to the array of individually controllable elements 104, according to one embodiment of the present invention. A cooling fluid 41 flows through the conduit 40, as indicated, absorbing heat from the array of individually controllable elements and removing it from the immediate vicinity of the array. A cooling unit 42 is also provided for cooling the fluid before it is returned to the conduit 40. The cooling unit 42 can also include a pump for driving the cooling fluid around the conduit. Alternatively, the cooling fluid can be driven round the conduit 40 by convection.

A controller 43 controls the extent of cooling of the fluid within the cooling unit 42 and, where appropriate, the flow rate of the fluid through the conduit 40. For example, the flow rate can be controlled by controlling the pump that drives the fluid where one is used or by control of a valve if the fluid is driven by convection. As shown in FIG. 7, a temperature sensor 44 can be provided in the array of individually controllable elements to enable the controller 43 to monitor the temperature of the array of individually controllable elements 104.

Although not specifically shown in FIG. 7, the conduit 40, arranged on the opposite side of the array of individually controllable elements to the side on which the radiation beam is incident, can be arranged in any convenient pattern to provide cooling across the entire surface of the array. For example, the conduit can have a plurality of parallel portions traversing from one edge of the array of individually controllable elements to an opposite edge. These parallel portions can be connected serially or in parallel. As a further alternative, the portion of the conduit in contact with the array of individually controllable elements can be a chamber that substantially covers the entire surface of the array of individually controllable elements. Other suitable configurations will be immediately apparent to the skilled person. It will also be appreciated that alternative forms of cooling elements can also be used, such as gas cooling or a peltier-effect cooling element. Gas cooling can take one of several forms. For example a fan can be arranged in proximity to the array of individually controllable elements to increase the flow of air over the array of individually controllable elements, thereby to adjust the transfer of heat from the array of individually controllable elements to the surrounding air. Alternatively, a dedicated jet of cooled gas can be directed onto the array of individually controllable elements.

A peltier-effect cooling element may not only be used as the cooling element itself, but can also be used as a system for controlling the cooling. For example a peltier-effect element can be provided between the array of individually controllable elements and a conduit, such as described above containing a cooling fluid. In such an arrangement, the peltier-effect element can be used to control the heat transfer from the array of individually controllable elements to the cooling fluid.

In a lithographic apparatus, a plurality of separate arrays of individually controllable elements can be used. In this case, a separate cooling element (with associated components such as cooling units and controllers described above) can be used for each array of individually controllable elements. However, in order to reduce the complexity of the lithographic apparatus and the cost of the apparatus, it can be desirable to provide a single cooling system for two or more of the arrays of the individually controllable elements.

Figure 8:
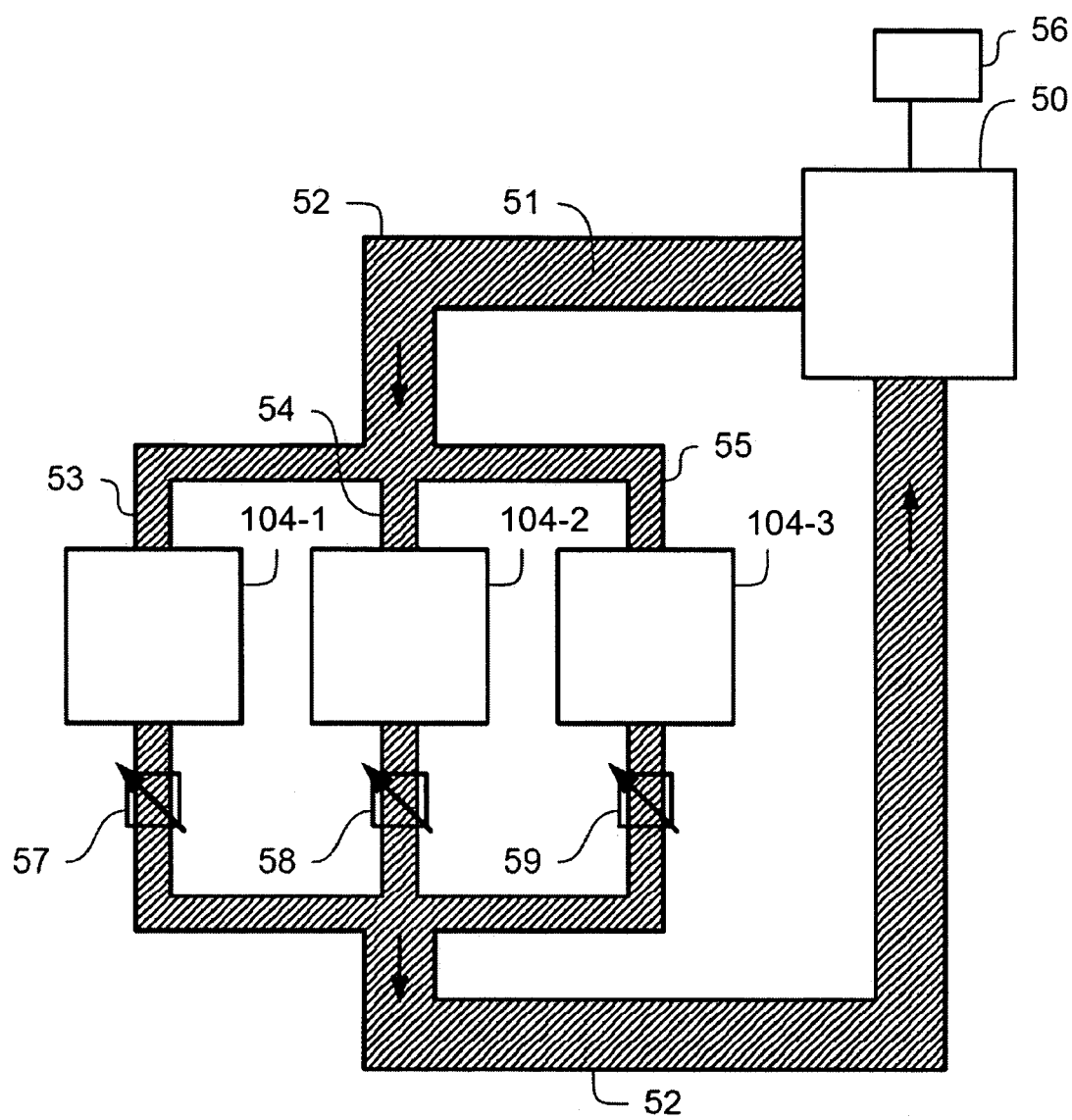

FIG. 8 shows such an arrangement, according to one embodiment of the present invention. In this case, three arrays of individually controllable elements 104-1, 104-2, 104-3 are cooled by a single cooling system. In this case, a cooling unit 50 is used to cool fluid 51 that are driven round a common conduit 52 (either by convection or by a pump). The common conduit 52 divides into separate array conduits 53, 54, 55. The array conduits 53, 54, 55 are bonded in arrangements as described above, to respective arrays of individually controllable elements 104-1, 104-2, 104-3 before recombining to form the common conduit 52 through which the cooling fluid 51 is recycled to the cooling unit 50.

A controller 56 is provided to control the cooling unit 50 and, where used, the pump for driving the cooling fluid round the system or the valve for controlling the convection flow of the fluid. In a system such as has been described above, a fixed proportion of the flow of the cooling fluid 51 will pass through each of the array conduits 53, 54, 55. For example, the fluid flow can be equal within each channel. Consequently, the capacity to absorb heat from each of the arrays 104-1, 104-2, 104-3 will be the same. However, because different patterns can be set on each of the arrays 104-1, 104-2, 104-3, it can be desirable to absorb different amounts of heat from each of the arrays. Therefore flow controllers 57, 58, 59 can be provided within each of the array conduits 53, 54, 55 such that the relative flow rate of the cooling fluid 51 through each of the array conduits, and hence the relative capacity for absorbing heat from each of the arrays of individually controllable elements 104-1, 104-2, 104-3 can be adjusted by the controller 56. Such a system can be used to ensure that the temperatures of each of the arrays of individually controllable elements 104-1, 104-2, 104-3 are substantially the same.

Figure 9:
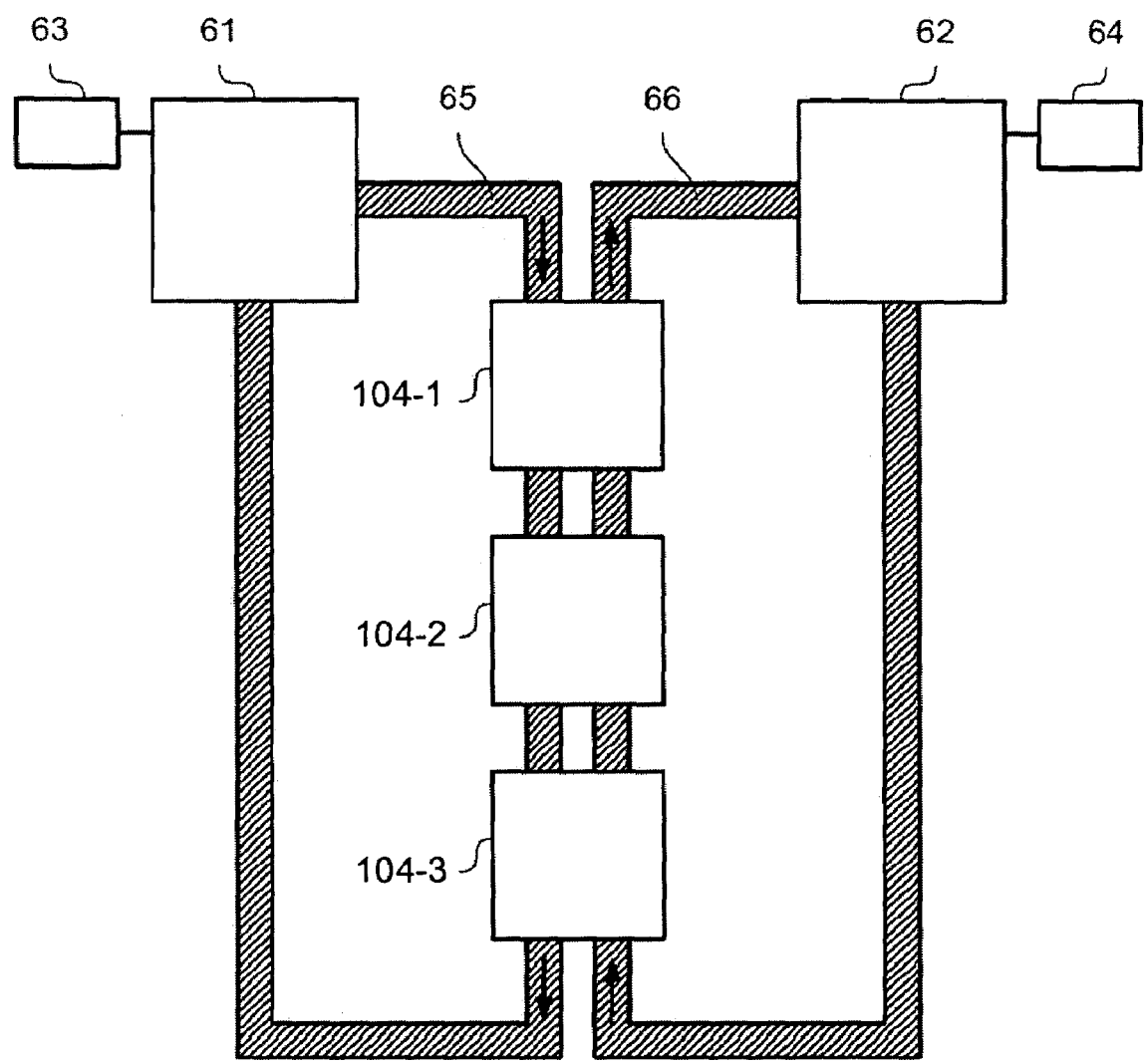

FIG. 9 shows a configuration for a fluid cooling system for a plurality of arrays of individually controllable elements, according to one embodiment of the present invention. This embodiment does not require separate flow controllers for the flow through each of the arrays of individually controllable elements. In this case, two cooling fluid circuits are provided, each with an associated cooling unit 61, 62 and controller 63, 64. The function of the cooling units 61, 62 and cooling control units 63, 64 described above corresponds to those in relation to FIG. 8 and the description will not be repeated. The fluid conduits are arranged such that, for each fluid system, the cooling fluid flows through conduits attached to each of the arrays of individually controllable elements 104-1, 104-2, 104-3 in turn. However, the order in which the cooling fluid passes through the conduits associated with each of the arrays of individually controllable elements is different for each of the cooling systems. For example, the cooling fluid 65 that is cooled by the cooling units 61 flows through the conduit connected to the first array 104-1 followed by the conduit connected to the second array 104-2 followed by the conduit associated with the third array 104-3 whereas the cooling fluid 66 that is cooled by the second cooling unit 62 initially flows through the conduit associated with the third array 104-3 followed by the conduit connected to the second array 104-2 and, finally, the conduit connected to the first array 104-1. As the cooling fluid flows through the conduits associated with each of the arrays of individually controllable elements 104-1, 104-2, 104-3, in turn, the fluid absorbs heat, causing its temperature to increase and thereby reducing its cooling effect when passing through the conduits connected to the next array of individually controllable elements. However, by providing two cooling circuits in which the cooling fluid cools the arrays of individually controllable elements in mutually opposite orders, the cooling effect on each of the arrays is largely even.

Figure 10:
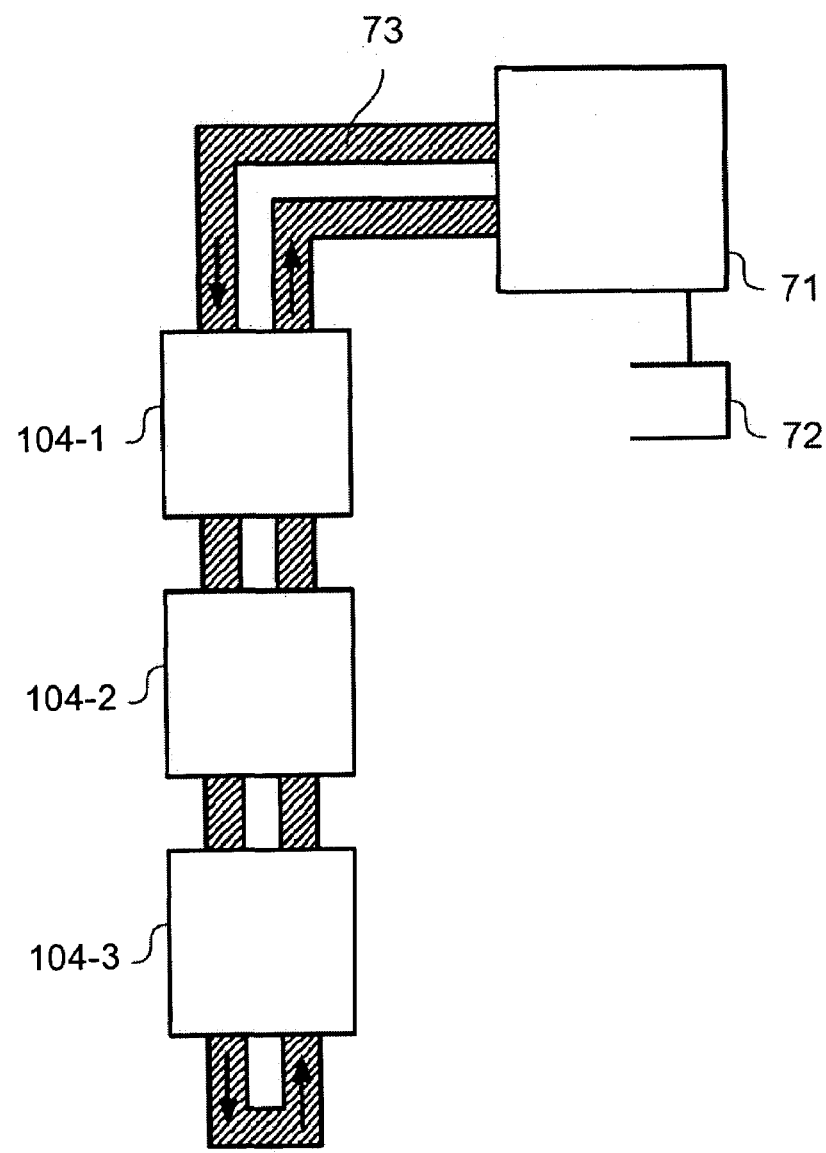

As shown in FIG. 10, a similar effect can be achieved using a single cooling circuit (namely with a single cooling unit 71 and a single controller 72), according to one embodiment of the present invention. This can be done by arranging the cooling fluid 73 to flow through conduits associated with first, second and third arrays of individually controllable elements 104-1, 104-2, 104-3 initially followed by conduits associated with the same arrays of individually controllable elements but in the reverse order, namely third, second and finally the first array of individually controllable elements.

In a variant of the cooling system in FIG. 10, the conduit is arranged such that the cooling fluid passes through, in order, conduits associated with the first, second and third arrays of individually controllable elements 104-1, 104-2 and 104-3 a single time only. In other words, the cooling circuit only cools each of the arrays of individually controllable elements once. Consequently, the temperature of the fluid in the conduit associated with the last array of individually controllable elements will be warmer than that in the first array of individually controllable elements (at least to a certain extent). Therefore if the arrays of individually controllable elements are all at the same temperature, the heat transfer from the first array of individually controllable elements to the fluid is greater than the heat transfer from the last array of individually controllable elements to the fluid. The temperature variations of the arrays of individually controllable elements 104-1, 104-2, 104-3 can, however, be kept sufficiently small provided the flow rate of the cooling fluid in the cooling circuit is sufficiently high. Accordingly, if the temperature uniformity requirements are not particularly high, such an arrangement can be suitable. However, if high levels of temperature uniformity are required, such an arrangement can not be practical due to the large flow rates of cooling fluid that would be required.

It will be appreciated that, where a fluid cooling system is used, the cooling fluid can be arranged to flow through conduits associated with different arrays of individually controllable elements in different orders than those described above. Likewise a greater number of cooling circuits can be used than have been described above. The number of different orders available increases with the number of different arrays of individually controllable elements used. Similarly, as the number of arrays of individually controllable elements increases, the benefit of using a greater number of cooling circuits also increases.

It will further be appreciated that, although the arrangements described above in relation to FIGS. 8, 9 and 10 have referred to the use of a plurality of separate arrays of individually controllable elements, similar cooling configurations can be used to provide uniform cooling for different parts of a single array of individually controllable elements.

It will be appreciated that, although the description above has described four different options for managing the heat generated by the use of the array of individually controllable elements as four separate embodiments, they are not exclusive and can be used in conjunction. For example, an array of individually controllable elements can be provided with both a heating element and a cooling element in order to prevent the temperature of the array of individually controllable elements from becoming either too cold or too hot, respectively. Likewise, in an arrangement in which ancillary control signals are provided to the array of individually controllable elements in order to maintain the temperature of the array of individually controllable elements when it would not otherwise be in use (namely when no pattern is to be formed on the array of individually controllable elements in order to pattern a beam of radiation), a heating element can also be provided to provide additional heating should the heating produced by the ancillary control signals not be sufficient. Likewise, the provision of a thermal reservoir that dampens the temperature fluctuations of the array of individually controllable elements can be used with any of the other embodiments. It will also be appreciated that, where a cooling and/or heating system is provided, the heat capacity of that system can be selected to provide the function of the thermal reservoir of the third embodiment. In general, any one of the embodiments described above can be used in conjunction with any combination of the other embodiments.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

What is claimed is:

1. A lithographic apparatus, comprising:
   an illumination system that conditions a beam of radiation;
   an array of individually controllable elements that pattern the beam;
   a projection system that projects the patterned beam onto a target portion of a substrate;
   a cooling element comprising at least one conduit in thermal contact with the array of individually controllable elements;
   a cooling unit configured to adjust a temperature of fluid flowing through the conduit;
   a flow controller configured to adjust a flow rate of the fluid flowing though the conduit; and
   a cooling controller configured to provide control signals to the flow controller to adjust the flow rate of the fluid flowing though the conduit and to the cooling unit to adjust the temperature of the fluid flowing through the conduit, thereby controlling absorption by the fluid of heat dissipating from the array of individually controllable elements.

2. The apparatus of claim 1, wherein the cooling controller determines heat generated by the array of individually controllable elements from the pattern being generated and controls the cooling element to absorb a corresponding amount of heat from the array of individually controllable elements.

3. The apparatus of claim 1, further comprising:
   a temperature sensor that monitors the temperature of the array of individually controllable elements, wherein the cooling controller determines an amount of heat to be absorbed from the array of individually controllable elements by the cooling element based on the monitored temperature and controls the cooling element to absorb the heat.

4. The apparatus of claim 1, wherein the fluid flowing through the conduit initially thermally contacts at least one of a plurality of regions of the array of individually controllable elements in a first order and subsequently thermally contacts the at least one of the plurality of regions in a second order different from the first order.

5. The apparatus of claim 4, wherein the second order is the reverse of the first order.

6. A device manufacturing method, comprising:
   using an array of individually controllable elements to pattern a beam of radiation;
   projecting the patterned beam of radiation onto a target portion of a substrate; and
   absorbing heat from the array of individually controllable elements using a cooling element comprising at least one conduit in thermal contact with the array of individually controllable elements; and
   adjusting a temperature and a flow rate of the fluid flowing through the conduit using an associated cooling controller to control absorption by the fluid of dissipated heat.

7. The apparatus of claim 1, wherein the cooling element further comprises a plurality of conduits in thermal contact with a plurality of regions of the array of individually controllable elements, wherein one of a plurality of flow controllers is configured to adjust a flow rate of fluid flowing through a respective one of the plurality of conduits, and wherein the cooling controller provides control signals to each of the plurality of flow controllers to adjust a flow rate of the fluid flowing through each of the plurality of conduits to control the absorption of the heat by the fluid from each of the plurality of regions, respectively.

8. A lithographic apparatus, comprising:
an illumination system configured to condition a beam of radiation;
an array of individually controllable elements configured to pattern the beam;
a projection system configured to project the patterned beam onto a target portion of a substrate;
a first cooling element comprising a first conduit arranged such that fluid flowing in the first conduit thermally contacts each of a plurality of regions of the array of individually controllable elements in a first order;
a first cooling controller coupled to the first cooling element to adjust a flow rate and a temperature of the fluid flowing through the first conduit;
a second cooling element comprising a second conduit arranged such that fluid flowing through the second conduit thermally contacts each of the plurality of regions of the array of individually controllable elements in a second order; and
a second cooling controller coupled to the second cooling element to adjust a flow rate and a temperature of the fluid flowing through the second conduit.

9. The apparatus of claim 8, wherein the second order is reverse of the first order.

10. A lithographic apparatus, comprising:
an illumination system configured to condition a beam of radiation;
an array of individually controllable elements configured to pattern the beam;
a projection system configured to project the patterned beam onto a target portion of a substrate;
a cooling element comprising at least one conduit in thermal contact with the array of individually controllable elements, wherein the fluid flowing through the conduit initially thermally contacts each of a plurality of regions of the array of individually controllable elements in a first order and subsequently contacts the each of the plurality of regions of the array of individually controllable elements in a second order; and
a cooling controller that adjusts a flow rate and a temperature of a fluid flowing through the conduit to control absorption of heat dissipating from the array of individually controllable elements.

11. The apparatus of claim 10, wherein the second order is the reverse of the first order.

12. The apparatus of claim 10, wherein the fluid flowing through the conduit initially contacts each of the plurality of arrays of individually controllable elements in a first order and subsequently contacts each of the plurality of arrays of individually controllable elements in a second order.

13. The apparatus of claim 1, wherein the cooling unit comprises a pump.

14. The apparatus of claim 8, further comprising:
a first cooling unit coupled to the first cooling element; and
a second cooling unit coupled to the second cooling element,
wherein the first cooling controller provides control signals to the first cooling unit to adjust the temperature of the fluid flowing through the first conduit, and
wherein the second cooling controller provides control signals to the second cooling unit to adjust the temperature of the fluid flowing through the second conduit.

15. The apparatus of claim 14, wherein:
the first cooling unit comprises a first pump; and
the first cooling controller provides control signals to the first pump to adjust the flow rate of the fluid flowing through the first conduit.

16. The apparatus of claim 14, wherein:
the second cooling unit comprises a second pump; and
the second cooling controller provides control signals to the second pump to adjust the flow rate of the fluid flowing through the second conduit.

17. The apparatus of claim 8, wherein the temperature of each of the plurality of regions of the array of individually controllable elements is substantially the same.

18. The apparatus of claim 10, further comprising:
a cooling unit coupled to the cooling element, wherein the cooling controller provides control signals to the cooling unit to adjust the temperature of the fluid flowing through the conduit.

19. The apparatus of claim 18, wherein:
the cooling unit comprises a pump; and
the cooling controller provides control signals to the pump to adjust the flow rate of the fluid flowing through the conduit.

20. The apparatus of claim 10, wherein the temperature of each of the plurality of regions of the array of individually controllable elements is substantially the same.

* * * * *